United States Patent [19]

Nioche et al.

[11] Patent Number: 5,397,426
[45] Date of Patent: Mar. 14, 1995

[54] DEVICE FOR PRODUCING SMART CARDS

[75] Inventors: Gerard Nioche, Clery Saint Andre; Dominique Perdoux, Mardie; Patrick Baudron, Biogny Sur Bionne, all of France

[73] Assignee: Giles Leroux, S.A., Loury, France

[21] Appl. No.: 124,588

[22] Filed: Sep. 22, 1993

[30] Foreign Application Priority Data

Sep. 22, 1992 [FR] France .................. 92 11430

[51] Int. Cl.$^6$ .............................................. B32B 31/00
[52] U.S. Cl. .................... 156/514; 156/556; 156/567; 156/570; 198/577; 198/588
[58] Field of Search ............... 156/511, 513, 514, 556, 156/567, 570; 198/577, 588, 589

[56] References Cited

U.S. PATENT DOCUMENTS

| | | | |
|---|---|---|---|
| 3,655,024 | 4/1972 | Horn | 198/588 X |
| 3,687,276 | 8/1972 | Pelletier | 198/588 X |
| 4,653,630 | 3/1987 | Bravin | 198/577 X |
| 4,687,536 | 8/1987 | Hiramatsu et al. | 156/514 X |
| 4,915,565 | 4/1990 | Bond et al. | 156/567 X |
| 5,097,939 | 3/1992 | Shanklin et al. | 198/577 X |

FOREIGN PATENT DOCUMENTS

| | | |
|---|---|---|
| 0197464 | 10/1986 | European Pat. Off. . |
| 0197847 | 10/1986 | European Pat. Off. . |
| 0208891 | 1/1987 | European Pat. Off. . |
| 0418759A2 | 3/1991 | European Pat. Off. . |
| 2624999 | 6/1989 | France . |
| WO88/081 | 10/1988 | WIPO . |

*Primary Examiner*—David A. Simmons
*Assistant Examiner*—Paul M. Rivard
*Attorney, Agent, or Firm*—Nixon & Vanderhye

[57] ABSTRACT

This invention relates to a device for producing smart cards, characterized in that it comprises a station (1) for milling recesses in batches of plastic cards associated with a station (3) for inlaying integrated circuits in said recesses, said milled cards being conveyed from milling station (1) to inlaying station (3) by a transfer system (2) making possible an adaptation to the speed differences of the stations (1, 3) and to the positioning differences of these stations (1, 3).

12 Claims, 8 Drawing Sheets

DEVICE FOR PRODUCING SMART CARDS

This invention has as its object a device that makes possible the milling of cavities in plastic cards, commonly called "smart cards," and the inlaying of integrated circuits in said cavities.

Cards with microcircuits are generally polyvinyl chloride cards printed and provided with a housing in which an integrated circuit or electronic "chip" is implanted.

The making of these housings and the inlaying is currently performed with various devices that are distinguished by their cost, the amount of cards machined per hour and the quality of the final product.

The devices known to date, however, have a considerable bulk and can cause beads, during the placing of the glue, around the cavity provided for the positioning of the chip, and they further do not make possible a quick milling of several thousand cards per hour.

The object of this invention is to eliminate these drawbacks by proposing a machine composed of two work stations managed by an automatic system, one of which has as its main function the milling of recesses in batches of plastic cards and the other the inlaying of integrated circuits in said recesses, a connecting system making possible the transfer of the cards from the first station to the second station.

This object is attained by the fact that the device for producing smart cards is characterized in that it comprises a station for milling of recesses in batches of plastic cards associated with a station for inlaying of integrated circuits in said recesses, said milled cards being conveyed from the milling station to the inlaying station by a transfer system that makes possible an adaptation to the speed differences of the stations and to the positioning differences of these stations.

According to another feature, the milling station comprises a means for presenting at least two cards on a plane support in front of as many stationary referencing means as there are cards presented simultaneously by the presentation means and as many machining means as there are cards presented simultaneously by the presentation means, said means for machinings being mobile in horizontal translation in a plane parallel to that of the support of the cards and, once positioned above the milling zone, mobile in vertical translation.

According to another feature, the inlaying station comprises a means for conveying cards and a means for conveying integrated circuits, said conveying means being displaced along parallel axes; a means for rotation between the conveying means; a means for grasping the integrated circuits routed on film, said grasping means being placed on the tangent of the means for conveying the integrated circuits and of the rotation means; a means for positioning the integrated circuits in the milled housings of the cards, said positioning means being positioned on the tangent of the rotation means and of the means for conveying cards; a means for placing glue in the milled housings positioned on the means for conveying the cards upstream from the positioning means; and a means for pressure on the integrated circuits positioned on the means for conveying the cards downstream from the positioning means.

According to another feature, the transfer device comprises two conveyors, a horizontal conveyor with variable height for the placing of the cards in the magazine of the inlaying station and a conveyor with an extendable flat belt to take care of the differences in length due to the differences of positions of the horizontal conveyor.

This characteristic arrangement makes it possible to machine simultaneously and to inlay the cards with a great precision and in a reduced space.

The following description, made with reference to the accompanying drawings for an explanatory and in no way limiting purpose, will make it possible to understand better the advantages, objects and characteristics of this invention.

In the accompanying drawings:

FIG. 4b represents a lateral detail view of the catch shown in FIG. 4a;

Figure 1:
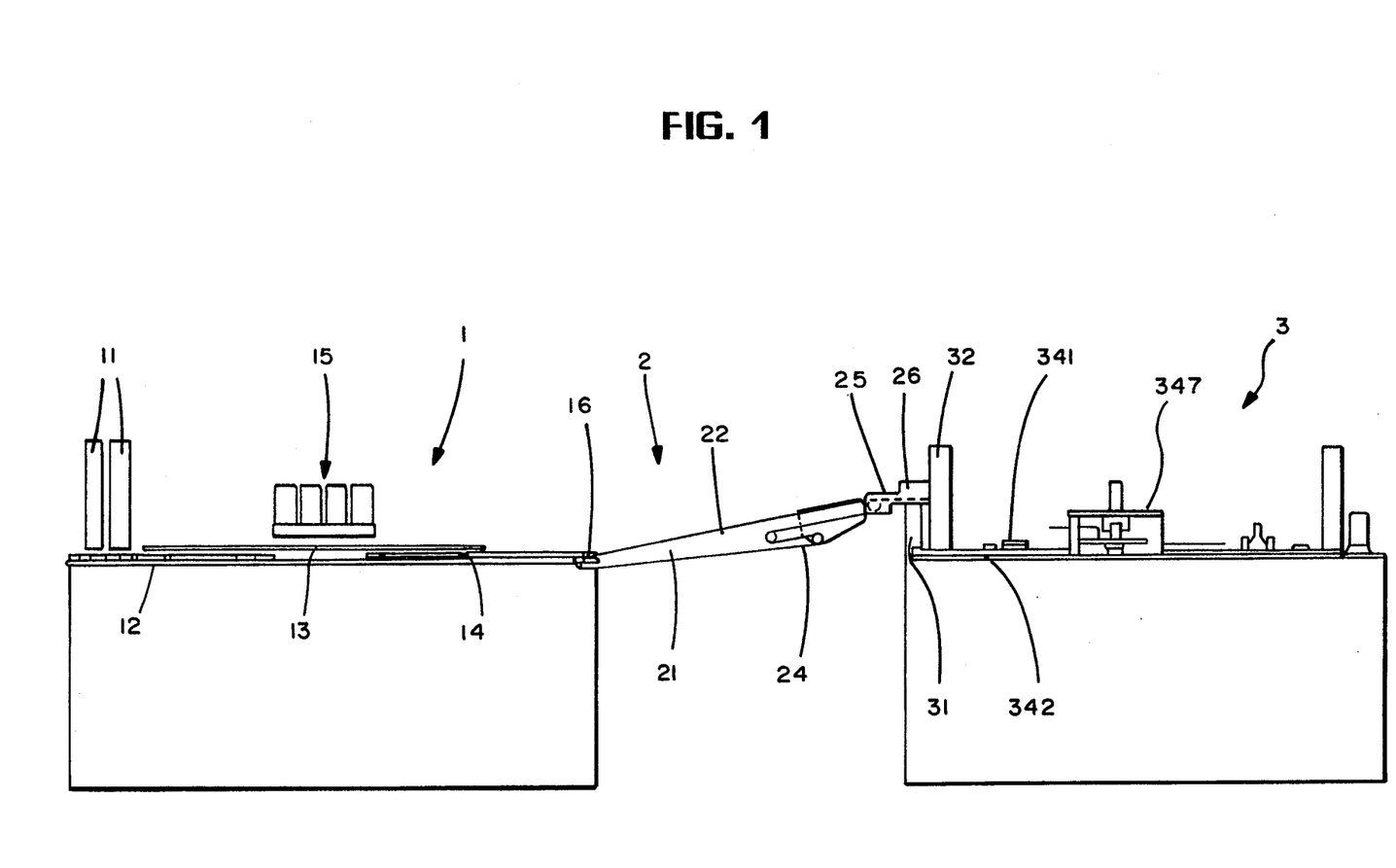
FIG. 1 represents a lateral diagrammatic view of a device according to the invention.

In FIG. 1, it is possible to see a device according to the invention comprising a first work station, or milling station (1), a system (2) for transfer of machined cards, a second work station, or inlaying station (3).

Milling station (1) comprises at least one magazine (11) with unmachined cards, three parallel belts between them, namely an input belt (12), a secondary belt (13) and an output belt (14), and a referencing and machining means (15).

On inlaying station (3), it is possible to see a linear guiding system (31), a buffer magazine (32), a means (341) for placing glue associated with a positioning means (342), a rotation means (347).

The system for transfer of the cards from station (1) to station (3) comprises a first conveyor (21) with extendable flat belt (22) mounted to pivot in a vertical plane at one of its ends around a horizontal pin (16) integral with station (1) and comprising at the other end a guide (23), not shown in the figure, sliding on a metal rod and provided at its base with a roller (24) and at one of its ends with a horizontal pin (25) on which a second conveyor (26) is mounted to pivot that is constantly horizontal and mobile in vertical translation and mounted at its end on a linear guiding system (31) which assures it a constant positioning in the vertical plane, placed opposite a buffer magazine (32) that makes it possible to absorb the instantaneous differences in speeds from one station to the next, the two conveyors together being mobile in height so as to be able to be adjusted as a function of the level of the cards in magazine (32).

Figure 2A:
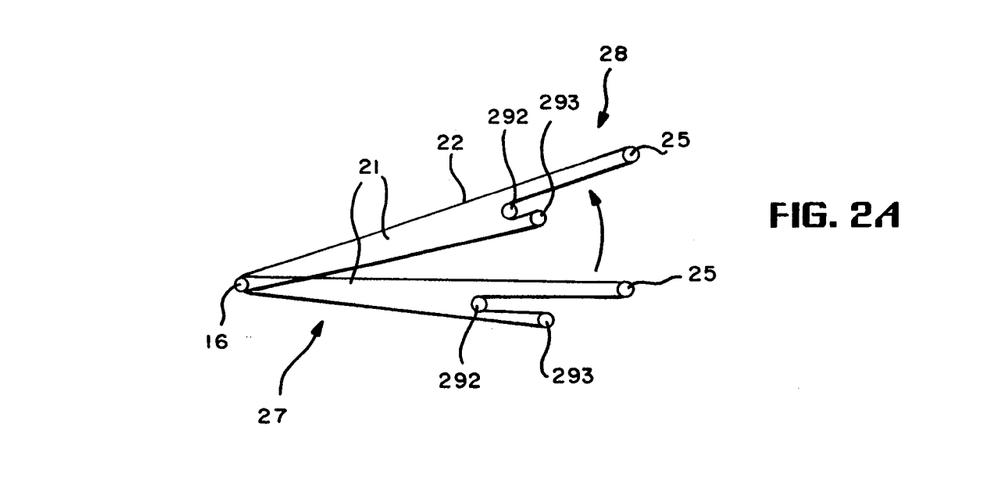
FIG. 2a represents a lateral view of the extendable conveyor.

In FIG. 2a, it is possible to see a conveyor (21) that can be extended in two work positions, a horizontal position (27) and an angular position (28) in which the distance between the two pins (16) and (25) has increased in relation to the first position, driving run (22) always being in the same length, the passage from one position to the next on the same imaginary straight line represented by broken lines of pin (25) being able to be achieved thanks to a system comprising two guides, not shown, and two rollers (292, 293), this system of variation making it possible for the second conveyor (26) integral with pin (25) to remain constantly on the same vertical path and in a horizontal plane during the movement.

Figure 2B:
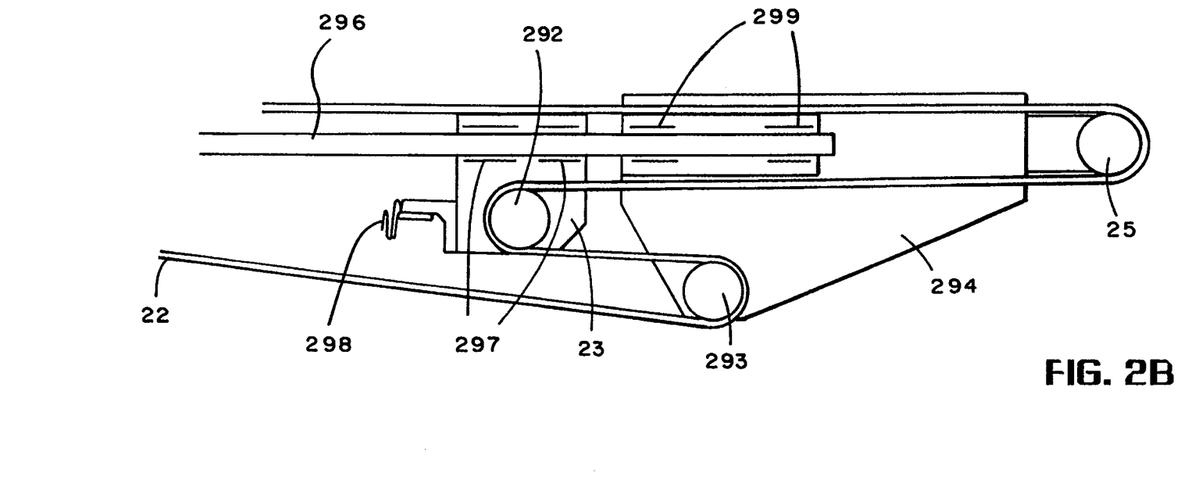
FIG. 2b represents a detail view of the guiding system of the extendable conveyor.

In FIG. 2b, it is possible to see in detail the system that makes it possible to adapt the length between the pins (16, 25) to the different positions of horizontal conveyor (26), not shown in the figure.

The system comprises two guides (23, 294) each comprising at its base a roller, (292) and (293) respectively, in free rotation.

A tension spring (298) is fastened, on the one hand, at one of its ends on guide (23) and, on the other hand, at the other end on pin (16), and guide (294) is mounted to pivot around pin (25) at its end opposite the one facing guide (23).

The two guides (23) and (294) are connected to one another by belt (22) stretched in an S shape around the two rollers (292) and (293).

To keep the tension of belt (22) constant at any point of conveyor (21) during its passage from a position making a certain angle with the ground at a higher angle position, the distance between the two rollers (292, 293) must vary to compensate for the gain in length between the two pins (16, 25), which can be achieved thanks to the two guides (23, 294) which can be displaced in translation on a metal rod (296), parallel to the upper face of conveyor (21), with ball guides (297, 299) by pulling on spring (298) which acts as reserve buffer for belt (22).

On the other hand, when the conveyor goes from a position making a certain angle with the ground at a lower angle, the length between pins (16, 25) decreases and the belt remains taut thanks to the increase in length between rollers (292, 293) due to the force exerted by spring (298).

Figure 3A:
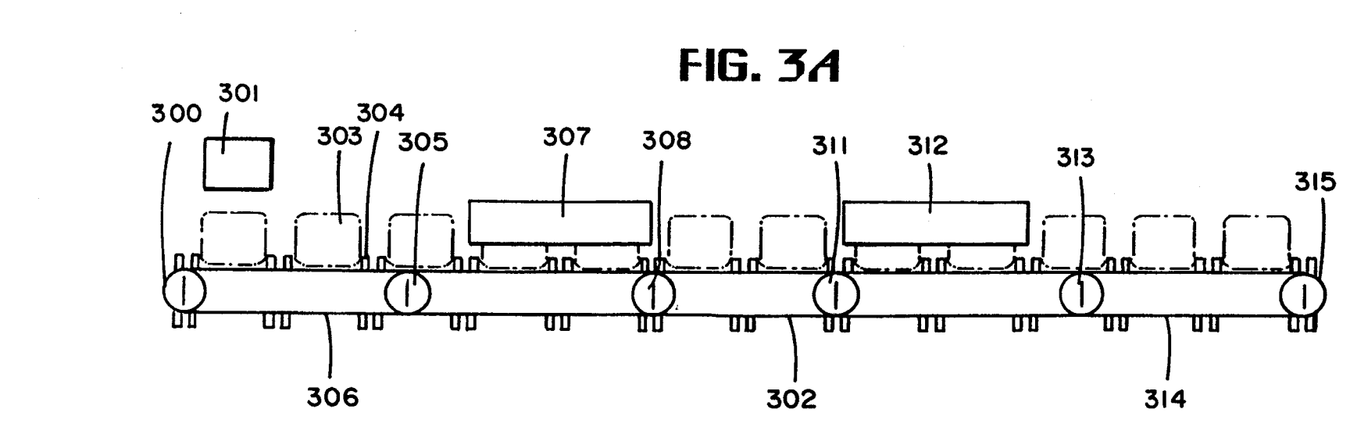
FIG. 3a represents a top view of the milling station of a device according to the invention.
Figure 3B:
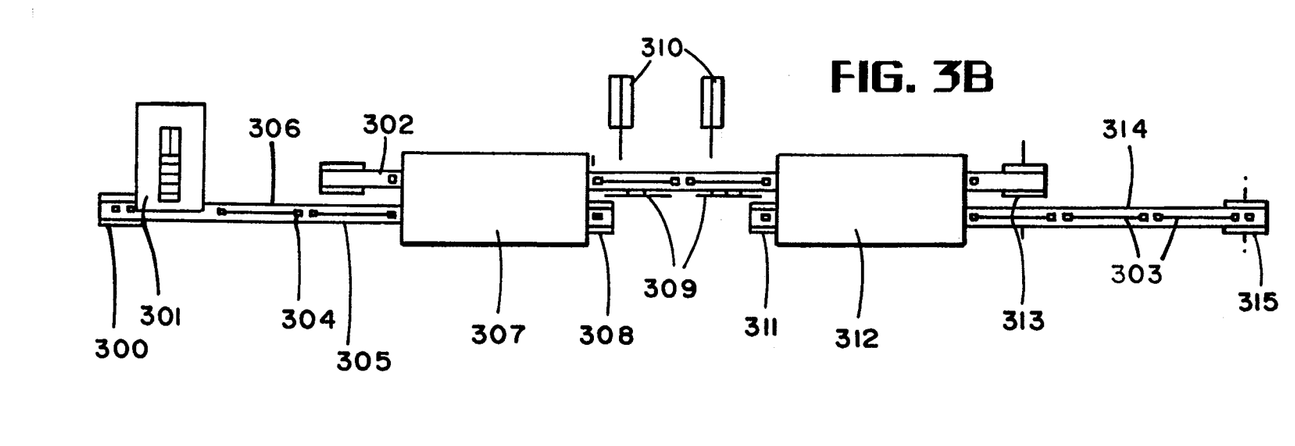
FIG. 3b represents a lateral view of the same milling station.

In FIGS. 3a and 3b there are represented a pulley (300), an unstacker (301), a secondary belt (302), cards (303), catches (304), a pulley (305), an input belt (306), a lift (307), a pulley (308), a pulley (311), a chute (312), a pulley (313), an output belt (314) and a pulley (315).

Pulleys (300) and (308) carry input belt (306), pulleys (305) and (313) carry output belt (314). Pulleys (300, 305, 308, 311, 313, 315) of known type, for example with teeth, are parallel to one another and driven by motors, not shown. Belts (302, 306, 314) are parallel to one another, are notched and carry catches (304). The motors do not drive the pulleys simultaneously, or with identical pitches. The operating mode of these motors is presented farther below, in FIG. 3b.

Unstacker (301), only the magazine of which is shown, is of known type and adapted to place the cards that are kept in its magazine one by one between two successive catches (304) of input belt (306).

Cards (303) are plastic and of known type.

Figure 4A:
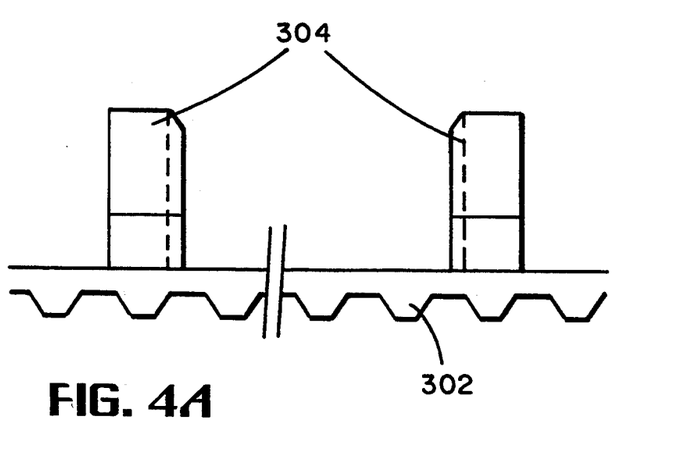
FIG. 4a represents a detailed top view of a catch of the same milling station.
Figure 4B:
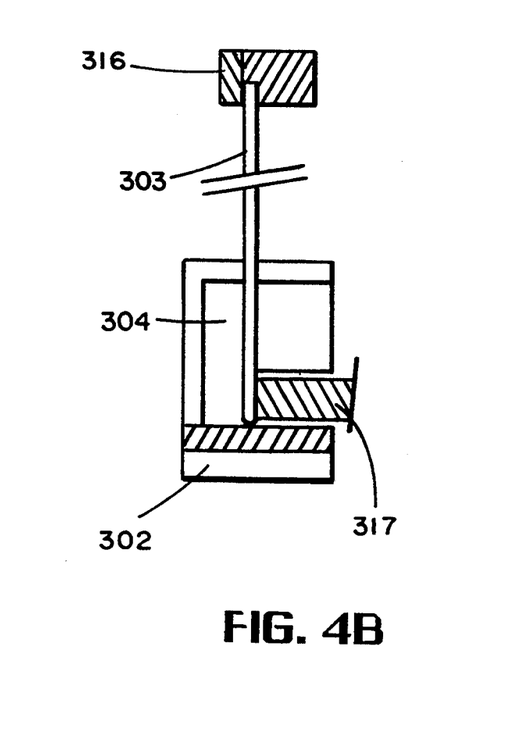

Catches (304), shown by a look at FIGS. 4a and 4b, are adapted to hold cards (303) during their displacement.

Lift (307) is adapted to transfer several cards (303) simultaneously from their position between catches (304) of input belt (306) to an identical position between catches (304) of secondary belt (302).

Chute (312) is adapted to transfer several cards simultaneously from their position between catches (304) of secondary belt (302) to an identical position between catches (304) of output belt (314).

Figure 5A:
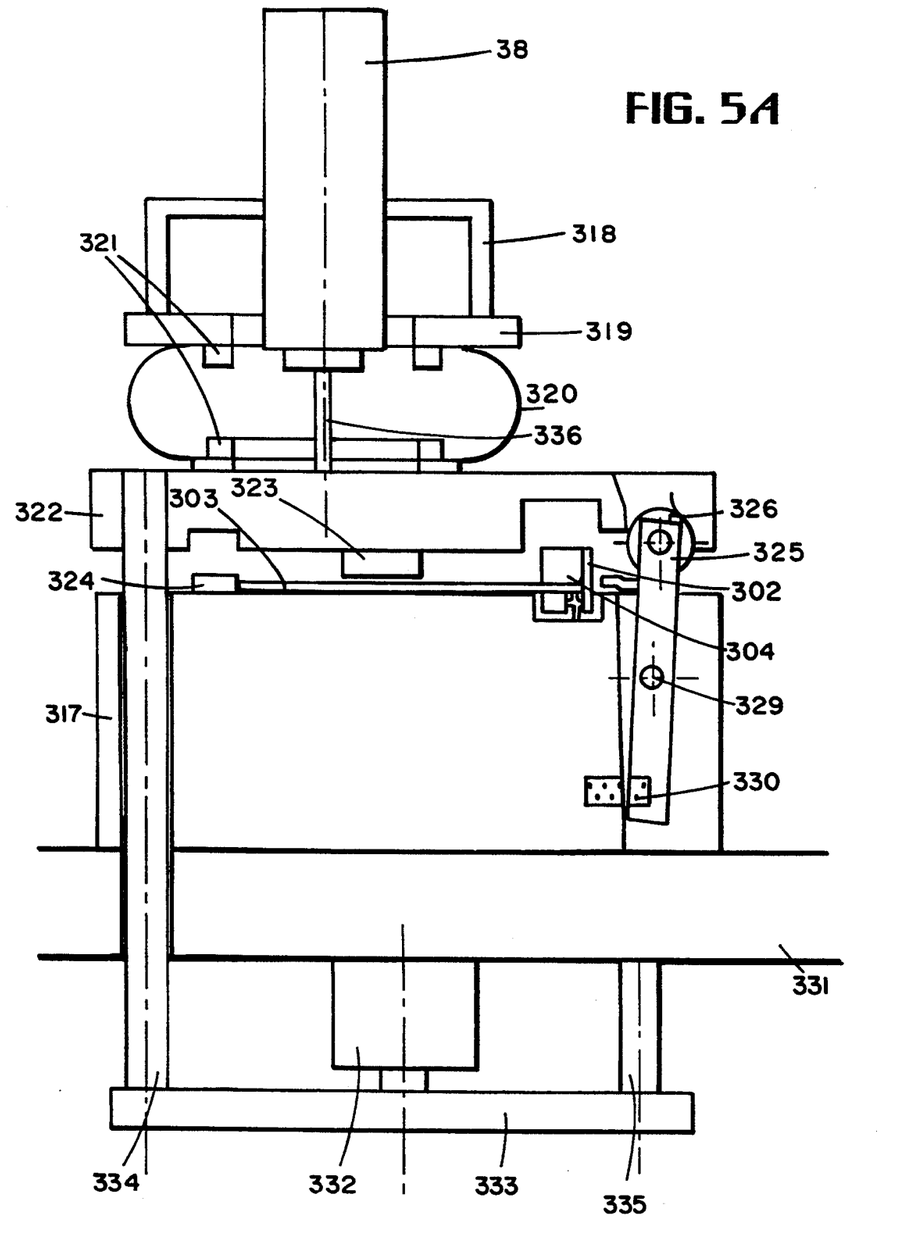
FIG. 5a represents a lateral detail view of a referencing means and of a machining means.
Figure 5B:
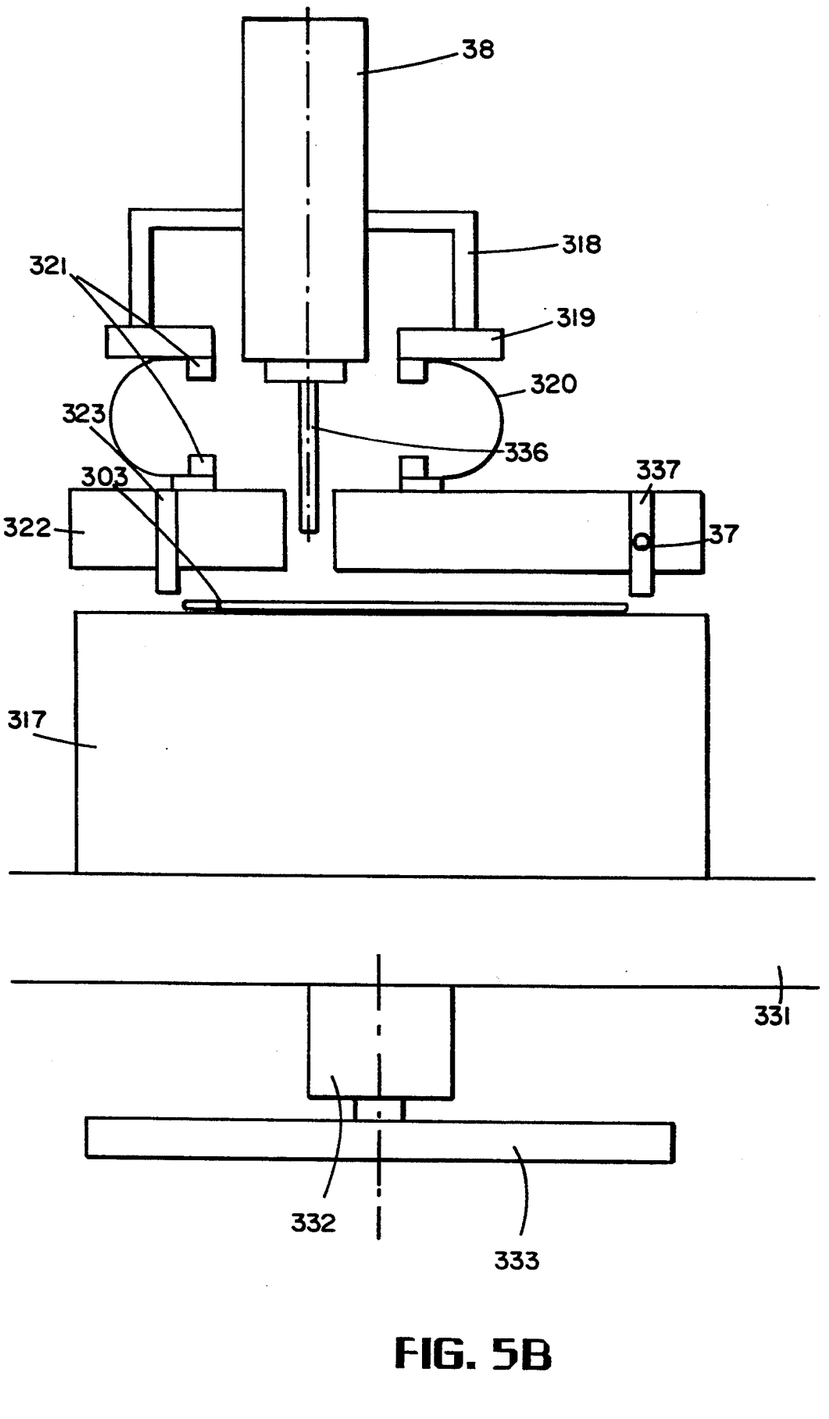
FIG. 5b represents a lateral detail view of the same referencing and machining means.

Also seen in FIG. 3b are referencing means (309) and machining means (310), which are shown by a look at FIGS. 5a and 5b. Referencing means (309) have a stationary station. Machining means (310) are mobile only simultaneously, in a plane parallel to cards (303) for their positioning above the cavity to be machined, and along an axis perpendicular to cards (303) for the milling of the cavities.

Referencing means (309) and machining means (310) act on cards (303) placed on secondary belt (302).

The device according to the invention operates according to the following sequence:

Unstacker (301) positions a card (303) between catches (304) of input belt (306) at each step of input belt (306), this step being equal to the distance between two successive pairs of catches (304).

When two cards (303) have entered-lift (307) and when two groups of two catches (304) free on secondary belt (302) are facing lift (307), the latter transfers the two cards onto secondary belt (302).

Secondary belt (302) advances with length steps double those of input belt (306), so that two unmachined cards are presented simultaneously in front of referencing means (309) and machining means (310). These two cards are simultaneously referenced by referencing means (309) and are simultaneously machined by machining means (310) then simultaneously displaced into chute (312).

Unstacker (301), input belt (306), lift (307) and secondary belt (302) constitute a means for presenting two cards (303) in front of referencing means (309).

Chute (312) transfers them simultaneously onto output belt (314) which advances at the same rate and at the same steps as input belt (306).

In FIGS. 3a and 3b, for reasons of clarity of drawing, only two cards (303) are transferred simultaneously by lift (307) or by chute (312). However, this number is preferably greater than 2 for the advantages of the invention to be best used.

For example, for the simultaneous machining of three cards (303), lift (307) and chute (312) transfer simultaneously three cards (303), three referencing means (309) are used as well as three machining means (310). The steps of the secondary belt are then triple the steps of input belt (306) and of output belt (314).

It is important to note that the optical or physical control systems of cards (303) can be combined with the device shown in FIG. 3a and 3b. These systems will then be preferably positioned facing output belt (314).

In FIG. 4a two catches (304) are represented that are placed on secondary belt (302) and in FIG. 4b secondary belt (302), a catch (304), a rail (316), a card (303) and a lower referencing means (317) are represented.

Catches (304) have a general "L" shape whose large side is located on the opposite side from its support on secondary belt (302).

Rail (316) at its upper part holds card (303), which is laterally resting on two successive catches (304). Finally, lower referencing means (317) serve as support for card (303). During the displacements of secondary belt (302), rail (316) and lower referencing means (317) are immobile.

In FIG. 5a, there are represented a spindle (38), a cylindrical cavity (318), a bellows support (319), a bellows (320), washers (321), a blank press (322), a stationary lateral referencing means (323), a stop (324), a lower referencing means (317), a card (303), secondary belt (302), a catch (304), a mobile beam (325), a wheel (326), an axis of rotation (329), a spring (330), a support (331), a tightening cylinder (332), a connecting part (333), two sliding pins (334, 335).

Spindle (38), cylindrical cavity (318), bellows support (319), bellows (320) and washers (321) each exhibit a rotational symmetry and are coaxial.

Washers (321) connect bellows (320) on the one hand to bellows support (319) and, on the other hand, to blank press (322).

Sliding pins (334) and (335) rigidly connect blank press (322) and connecting part (333) and slide in lower referencing means (317). Connecting part (333) connects the head of cylinder (332) to sliding pins (334, 335).

Spindle (38) is of known type and carries a milling cutter (336). It is immobile vertically and horizontally.

Cavity (318) carries a suction connection, not shown. The suction through cavity (318) makes possible both the cooling of spindle (38) and the sucking up of the machining cuttings.

Bellows support (319) is adapted to allow air to pass between bellows (320) and cavity (318).

Bellows (320), made of flexible material, makes possible a displacement of spindle (38) independently of the displacement of blank press (322).

Washers (321) are adapted to fasten, in a fluidtight manner, bellows (320) on the one hand to bellows support (319) and on the other hand to blank press (322).

Blank press (322) comprises indentations adapted to allow stop (324), secondary belt (302) and catch (304) to penetrate. Blank press (322) comprises, opposite wheel (326) an oblique rolling face, so that when wheel (326) protrudes on the upper part of blank press (322), it is placed more to the left than when it does not protrude.

Stationary lateral referencing means (323) is shown by a look at FIG. 5b.

Stop (324) is fastened to lower referencing means (317) which comprises indentations for the passage of catch (304), of secondary belt (302) and of spring (330), and carries axis of rotation (329).

Mobile beam (325) carries, at its upper part, the axis of rotation of wheel (326). It is mobile around axis of rotation (329) and receives, on its lower part, one of the supports of spring (330). In addition, it carries a mobile referencing means (337), that can be seen in FIG. 5b; consisting of a plate perpendicular to the axis of the beam, a plate adapted to rest on secondary belt (302).

Spring (330) works in compression between an indentation of lower referencing means (317) and mobile beam (325).

Support (319) carries two identical units as shown in FIGS. 5a and 5b.

Tightening cylinder (332) is of known type. Its extension causes the tightening of blank press (322) against card (303), the rotation of wheel (326) on the rolling face of blank press (322) and its displacement to the left and the support of mobile referencing means (337) on secondary belt (302).

In FIG. 5b is found spindle (38), cylindrical cavity (318), bellows support (319), bellows (320), washers (321), blank press (322), stationary lateral referencing means (323), lower referencing means (317), a card (303), support (331), tightening cylinder (332), connecting part (333), a milling cutter (336), a lateral referencing means (337) mobile in rotation around a pin (37).

Stationary lateral referencing means (323) is fastened to blank press (322), as well as axis of rotation (329). When blank press (322) approaches card (303) and touches it, mobile lateral referencing means (337) is displaced while holding card (303) tightly against stationary lateral referencing means (323).

The extension of tightening cylinder (332) thus makes possible the setting of card (303) and its locking into a referenced position in a fixed manner.

After the extension of tightening cylinder (332), spindle (38) is displaced toward card (303) and milling cutter (336) performs a milling intended to receive an electronic component.

The stationary referencing means consist of lower referencing means (317), stop (324) and stationary lateral referencing means (323).

The mobile referencing means consist of beam (325), mobile lateral referencing means (337) and blank press (322). They are adapted to hold cards (303) tightly against the stationary referencing means.

The machining means consist of spindles (38) and milling cutters (336).

Since several referencing means and several machining means are connected to support (331), several cards (303) are machined simultaneously with high referencing precision.

Figure 6A:
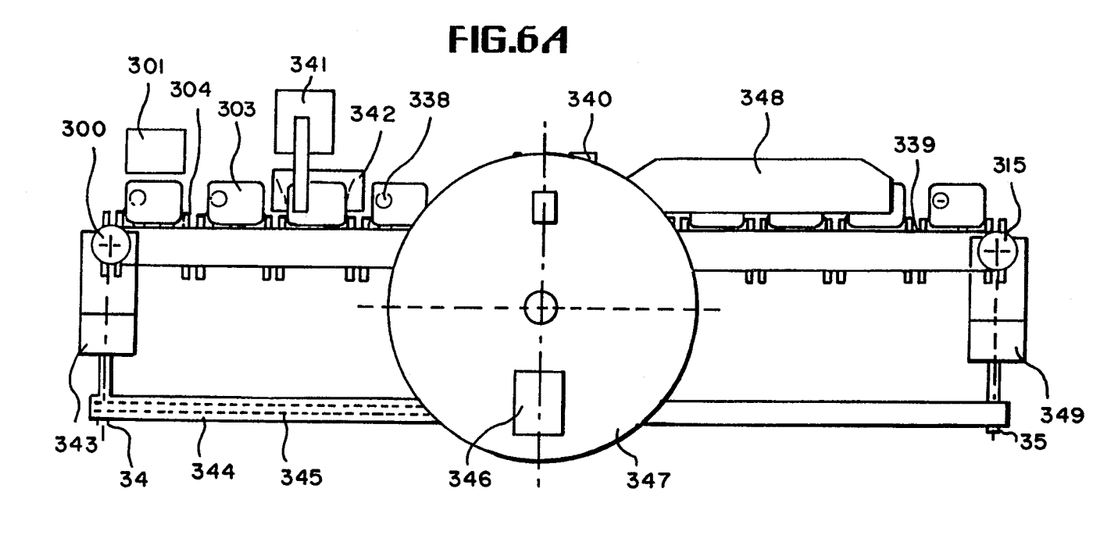
FIG. 6a represents a lateral view in section of the inlaying station of a device according to the invention.

In FIG. 6a, there are represented a pulley (300), an unstacker (301), cards (303) carrying millings (338), catches (304), a means (339) for conveying cards, a positioning means (340), a pulley (315), a means (341) for placing glue, a positioning means (342) associated with means (341) for placing glue, a gearmotor (343) carrying an output pin (34), a means (344) for conveying integrated circuits (345), a grasping means (346), a rotation means (347), a pressure means (348) and a gearmotor (349) carrying an output pin (35).

Pulleys (300) and (315) carry means (339) for conveying cards and are of known type, for example with teeth parallel to one another and driven by motors. Means (339) for conveying cards is, for example, a notched belt.

Conveying means (339) and (344) displace, along parallel axes, cards (303) and integrated circuits (345), respectively.

Figure 7A:
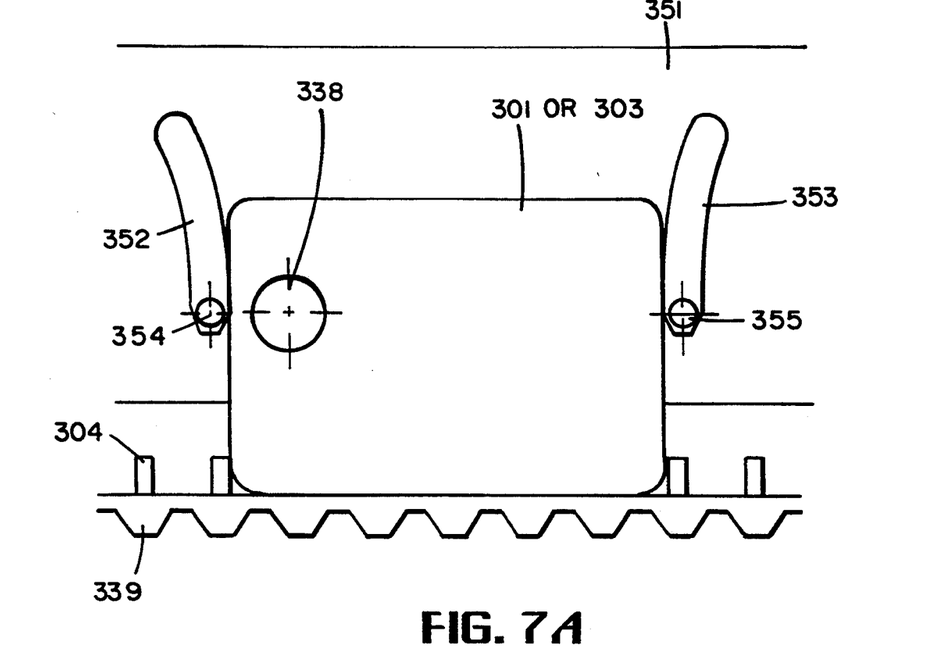
FIG. 7a represents a detail view, seen from above, of a positioning means.
Figure 7B:
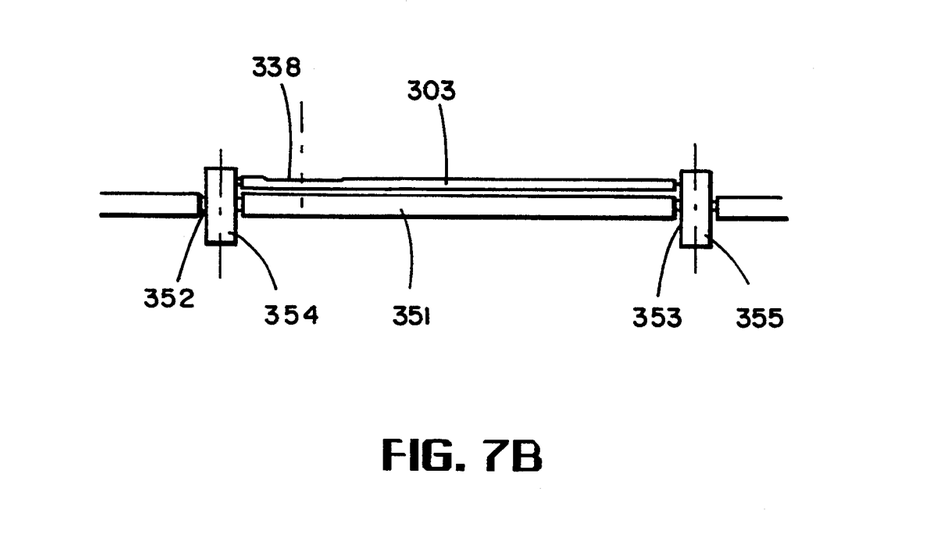
FIG. 7b represents a detail view, lateral and in section, of the same positioning means.

The positioning means is shown by a look at FIGS. 7a and 7b.

Means (341) for placing glue is of known type. It comprises an arm and is adapted to deposit constant amounts of glue in machinings (338). It is associated with a positioning means (342) that is identical with positioning means (340).

The two gearmotors (343, 349) are identical and, together, give to conveying means (344) a movement of smaller amplitude than that of conveying means (339), but in a synchronized way. They carry respectively the slow pins (34, 35) and fast pins, not shown, connected to means (339) for conveying cards.

Means (344) for conveying integrated circuits is preferably of plastic provided with drive notches.

Grasping means (346) is adapted to position on means of rotation (347) an integrated circuit (345) that it takes from conveying means (344). It is of known type comprising, for example, an actuator performing an upward thrust on the integrated circuit and a suction head holding integrated circuits (345) during the rotation of rotation means (347), tangent to conveying means (339, 344), and adapted to present, in front of positioning means (340), the integrated circuits (345) that grasping means (346) have furnished for it.

Grasping means (346) is therefore on the tangent of rotation means (347) and of conveying means (344). Also, positioning means (340) is on the tangent of rotation means (347) and of conveying means (339).

On the approach of conveying means (339), means (341) for placing glue is upstream from positioning means (340) and pressure means (348) downstream from this same positioning means (340).

Positioning means (340) is adapted to present card (303) opposite the integrated circuit presented by rotation means (347).

Pressure means (348) is adapted to perform a pressure on the integrated circuits present on cards (303) at the output of positioning means (340) during a period greater than the drying or polymerization period of the glue. It is of known type, for example consisting of a suitable separation slide mechanism.

Figure 6B:
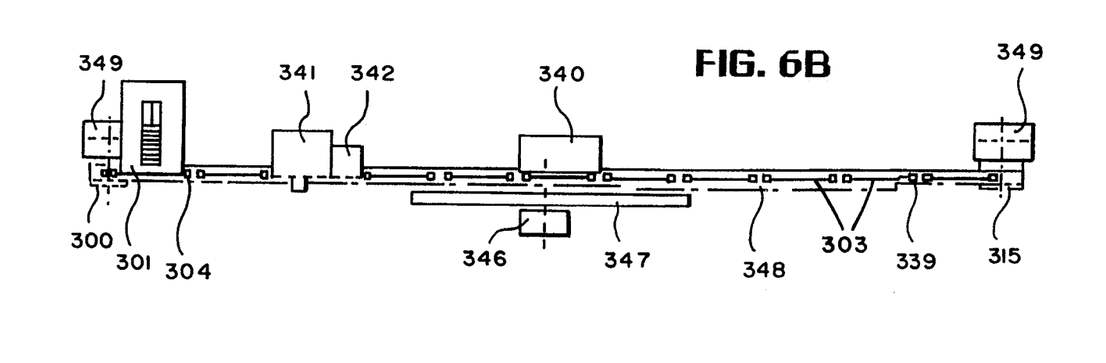
FIG. 6b represents a top view of the same inlaying station

In FIG. 6b is found pulley (300), unstacker (301), cards (303), catches (304), conveying means (339), pulley (315), means (341) for placing glue associated with positioning means (342), gearmotor (343), grasping means (346), rotation means (347), pressure means (348) and gearmotor (349).

The device according to the invention operates according to the following sequence:

Unstacker (301) positions a card (303) between catches (304) of conveying means (339) at each of its steps. This step is equal to the distance between two successive groupings of two catches.

At each step, means (339) for conveying cards presents a card (303) in front of means (341) for placing glue associated with positioning means (342), in front of positioning means (340), at the input and output of pressure means (348).

At each step, conveying means (344) presents an integrated circuit (345) in front of grasping means (346), rotation means (347) performs a rotation of a half-turn and presents an integrated circuit in front of positioning means (340), means (341) for placing glue deposits a predetermined amount of glue in the milling (338) of a card (303), positioning means (340) making possible the positioning of an integrated circuit in a milling (338) coated with glue.

Each card (303) therefore receives successively, during the displacement of conveying means (339), an amount of glue, an integrated circuit (345) and a pressure on this circuit (345).

It is important to note that systems of optical, electrical, magnetic or physical control of cards (303) can be combined with the device shown in FIGS. 6a and 6b, these systems then being positioned according to their function.

For example, the test of an integrated circuit before positioning on card (303) can be placed on conveying means (344) or on rotation means (347). The electric test of cards (303) can be placed at the output of the device. The optical checking of the dimensional characteristics of card (303) can be placed upstream from means (341) for placing glue.

According to a variant, the means for conveying integrated circuits (345) carries two rows of integrated circuits (345). In this case, conveying means (344) performs two times fewer steps than conveying means (339) and grasping means (346) is adapted to take integrated circuits (345) on both rows.

In FIG. 7a it is possible to see conveying means (339) carrying catches (304), a card (303) carrying a milling (338) and a support (351), for example of metal, comprising two grooves (352, 353), two lugs (354, 355) that are located in grooves (352, 353).

The two grooves (352, 353) have arc shapes and their minimal spacing is slightly less than the length of a card (303). Their width is constant on the arc. Groove (352), placed on the left of card (303), has an arc center on its right. The high portions of grooves (352, 353) project widely beyond the height of card (303). The low portions of grooves (352, 353) form tangents of cards (303).

Lugs (354, 355) are of cylindrical shape and have a diameter slightly less than the width of grooves (352,353). They are moved by mechanical systems, not shown, adapted to displace them upward in grooves (352, 353) along the arcs.

Lugs (354, 355) are in the upper portion of grooves (352, 353) during the displacement of conveying means (339) and of cards (303). Conveying means (339) stops approximately in the position described in FIG. 7a. Lugs (354, 355) are then displaced to the lower portion of grooves (352, 353) and laterally lock card (303) in a perfectly referenced position.

FIG. 7b corresponds to the section of FIG. 7a, along a plane passing through the axes of lugs (354, 355). A card (303) is seen there carrying a milling (338), support (351), grooves (352, 353) and lugs (354, 355).

Of course, this invention cannot be limited to the preceding description of some of its embodiments, that can undergo modifications, without thereby going outside the scope of the invention.

We claim:

1. Device for producing smart cards, comprising:
   a milling station for milling recesses in batches of plastic cards;
   an inlaying station for inlaying integrated circuits in said recesses;
   a buffer magazine operatively associated with said inlaying station; and
   a transfer system for transferring milled cards containing recesses from said milling station to said inlaying station, said transfer system comprising a first conveyor pivotable in a vertical plane and adjustable as a function of a level of cards in said buffer magazine and a second horizontal conveyor movable in a vertical direction and disposed opposite said buffer magazine for accommodating instantaneous differences in speeds from one station to the next.

2. Device according to claim 1, wherein said milling station comprises presentation means, stationary referencing means and machining means, said presentation means presenting at least two cards on a plane support in front of as many stationary referencing means as there are cards presented simultaneously by said presentation means and as many machining means as there are cards presented simultaneously by said presentation means, said machining means being mobile in horizontal translation in a plane parallel to that of said support of cards and, once positioned above a milling zone, mobile in vertical translation.

3. Device according to claim 1, wherein said inlaying station comprises a means for conveying cards and a means for conveying integrated circuits, said means for conveying cards and said means for conveying integrated circuits being displaced along parallel axes; a rotation means for rotation between said conveying means for conveying cards and said means for conveying integrated circuits; a grasping means for grasping integrated circuits routed on film, said grasping means being placed on a tangent of said means for conveying the integrated circuits and of said rotation means; positioning means for positioning integrated circuits in milled recesses of said cards, said positioning means being positioned on the tangent of said rotation means and of said means for conveying cards; a means for placing glue in said recesses positioned on the means for conveying the cards and located upstream of the positioning means for positioning integrated circuits in said milled recesses; and pressure means for applying pressure on the integrated circuits positioned on the means for conveying the cards and located downstream of the positioning means for positioning integrated circuits in said milled recesses.

4. Device according to claim 2, wherein said presentation means comprises an unstacker, an input belt, a lift, and a secondary belt, said unstacker transferring cards one by one onto said input belt, said lift simultaneously transferring several cards from said input belt to said secondary belt, which performs steps as many times more than steps performed by said input belt as there are cards transferred simultaneously by said lift.

5. Device according to claim 4, comprising an output belt and a chute, said transferring simultaneously, from said secondary belt to said output belt, as many cards as said lift.

6. Device according to claim 4, wherein said input belt, said secondary belt and said output belt carry catches for holding cards.

7. Device according to claim 2, and further comprising mobile referencing means for holding cards tightly against said stationary referencing means.

8. Device according to claim 3, wherein said grasping means comprises a pressure means and a suction means.

9. Device according to claim 3, wherein said positioning means comprises lugs that are mobile in arc-shaped grooves.

10. Device according to claim 2, wherein said means for placing glue is associated with a positioning means.

11. Device according to one of claims 3, wherein said means for conveying cards comprises a notched belt provided with catches.

12. Device according to one of claims 3, wherein said means for conveying cards and said means for conveying integrated circuits are connected by at least a gearmotor synchronizing their displacements.

* * * * *